US007024002B2

(12) United States Patent
Dickey

(10) Patent No.: US 7,024,002 B2
(45) Date of Patent: Apr. 4, 2006

(54) METHOD AND APPARATUS FOR SPATIALLY ENHANCING THE STEREO IMAGE IN SOUND REPRODUCTION AND REINFORCEMENT SYSTEMS

(76) Inventor: Baron C. Dickey, 6809 96th Ave. SE., Mercer Island, WA (US) 98040

( * ) Notice: Subject to any disclaimer, the term of this patent is extended or adjusted under 35 U.S.C. 154(b) by 0 days.

(21) Appl. No.: 10/966,529

(22) Filed: Oct. 14, 2004

(65) Prior Publication Data

US 2005/0163329 A1 Jul. 28, 2005

Related U.S. Application Data

(60) Provisional application No. 60/539,430, filed on Jan. 26, 2004.

(51) Int. Cl.

| | |
|---|---|
| ***H04B 3/00*** | (2006.01) |
| ***H03G 3/00*** | (2006.01) |
| ***H03G 5/00*** | (2006.01) |
| ***H04R 5/02*** | (2006.01) |
| ***H04R 5/00*** | (2006.01) |

(52) U.S. Cl. ........................ 381/77; 381/300; 381/104; 381/98; 381/61; 381/17; 381/1; 381/103

(58) Field of Classification Search ..................... None
See application file for complete search history.

(56) References Cited

U.S. PATENT DOCUMENTS

| | | | | |
|---|---|---|---|---|
| 4,357,490 | A * | 11/1982 | Dickey | 381/336 |
| 5,386,478 | A * | 1/1995 | Plunkett | 381/103 |
| 5,809,153 | A * | 9/1998 | Aylward et al. | 381/337 |
| 6,069,962 | A * | 5/2000 | Miller | 381/300 |
| 6,862,356 | B1 * | 3/2005 | Makino | 381/1 |

* cited by examiner

*Primary Examiner*—Laura A. Grier
(74) *Attorney, Agent, or Firm*—Brian L. Johnson; Davis Wright Tremaine LLP

(57) ABSTRACT

Sound reproduction and reinforcement systems and methods are presented herein for spatially enhancing stereo images typically used such performances as those involving music. The embodiments seek to expand the amount of audience area that would receive a sound image that maintains sound reproduction fidelity regarding spatial orientation of sound sources involved in an original performance. To expand the audience area receiving spatially faithful sound reproduction certain characteristics of sound have been first studied to find important factors involved.

21 Claims, 16 Drawing Sheets

METHOD AND APPARATUS FOR SPATIALLY ENHANCING THE STEREO IMAGE IN SOUND REPRODUCTION AND REINFORCEMENT SYSTEMS

BACKGROUND OF THE INVENTION

1. Field of the Invention

The present invention relates generally to systems and methods for enhancing the performance of sound reproduction and reinforcement systems and more particularly for enhancing the performance of these systems over broad listener areas.

2. Description of the Related Art

Since the advent of sound recording near the end of the nineteenth century, an effective methodology has been sought to make the reproduction of sound, especially music, approach as closely as possible the sound field created by the original live source. Challenges remain including increasing the audience listening area in which sound is faithfully reproduced. Sound reproduction system engineering implementations have focused on “electrostatic emitters” which are extremely directional in their radiation response and offer only a single listening location and electrodynamic emitters which have been designed for the uniform distribution of sound energy over a wide area.

Despite occasional announcements that the ultimate perfection has been reached and despite the increased number of separate emitters being utilized to create a theater or high-end home sound reproduction system, fidelity problems remain. Relatively accurate reproduction tends to exist. Unfortunately, it is restricted to central on axis listening positions, which are locations that are equidistant from primary emitters. For other listening positions spatial anomalies distort the associated sound field. With conventional approaches, for listening locations that are off the central axis of the emitters the “stereo image” degenerates. Consequently, for a group of original sound sources, such as instruments being played together, in a live performance the spatial orientation of the reproduced sound sources would not be the same as the spatial orientation of the live performance. Instead, the spatial orientation of the reproduction is compressed, expanded or otherwise changes relative to the spatial orientation of the original performance based upon listening position. In live performance sound reinforcement installations where emitters are used to reinforce the sound produced by instruments being played and singers’ voices, performance frequently declines to the point where the emitters being used become the only acoustic image realized.

Since sound obeys an inverse square law relative to distance, as the distance between emitters and listener increases, the sound intensity decreases. As a result, the sound images that are created by two or more emitters at any listening position not equidistant from both emitters will have a geometry distortion introduced. In these off-axis listener positions, the instruments become crowded together and the instrument closest to the off axis listener becomes louder and the “stereo image” of central instruments rapidly degenerates. The incorporation of a third “center channel” has been tried, but this can add significantly to the system’s complexity, and offers limited results.

A number of other devices have been proposed to increase the area in which the audience will experience faithful sound reproduction. Some have proposed the use of frequency sensitive elements to selectively phase shift and redirect the electrical energy to various emitter means. The proposed devices tend to add complexity and degrade the final reproduced sound. Others have proposed devices that attempt to stimulate the listening room utilizing radiation from the emitter without regard to room dependant anomalies such as wave cancellations that occur from reflective walls to produce an improvement.

Further, the industry has expended a great deal of effort measuring the effect of interaural time difference (ITD). This involves the time difference created by the physical path length difference created by the human head and the time differences created by the path lengths from sound source to listener. Various methods have been proposed to compensate for geometric anomalies. In modern recording studios it is common practice to use many microphones and recorder channels to capture a performance. Results can be disappointing since time and phase information that relate one instrument to another can be lost prior to recording distribution and is usually unavailable to sound reinforcement systems. As a result a less than ideal situation occurs in which differences in loudness of emitters are relied upon as the cues for spatial location to recreate sound image files. The challenge of increasing the audience listening area in which sound is faithfully reproduced remains by in large elusive.

BRIEF SUMMARY OF THE INVENTION

Aspects of the invention include a system for an audience area, the audience area having a near field compensation border, the audience area being adjacent a second area along the near field compensation border, the second area having a first reference location. The system includes a plurality of sound emitters configured to be placed in a first configuration in the second area. Furthermore, aspects include an emitter energy apportioner configured to be coupled to the plurality of sound emitters to send signals to the sound emitters having energy distributed amongst the signals such that the sound emitters being in the first configuration in the second area collectively emit a first sound pattern, the first sound pattern configured to be received having a first sound energy amplitude for at least a first sound frequency by a sound receiver at a first location in the audience area a first distance from the near field compensation border and a second distance from the first reference location with the sound receiver facing the first reference location in the second area, the first sound pattern configured to be received having a second sound energy amplitude for at least the first sound frequency by the sound receiver at a second location in the audience area a third distance from the near field compensation border and a fourth distance from the first reference location with the sound receiver facing the first reference location in the second area, the first distance approximating the third second distance, the second distance being different from the fourth distance, and the first sound energy amplitude approximating the second sound energy amplitude.

Further aspects include a system for an audience area, the audience area having a near field compensation border, the audience area containing a sound receiver having a left channel sound receiver and a right channel sound receiver, the audience area being adjacent a second area along the near field compensation border, the second area having a first reference location. The system includes a plurality of sound emitters configured to be placed in a first configuration in the second area. Further aspects include an emitter energy apportioner configured to be coupled to the plurality of sound emitters to send signals to the sound emitters having energy distributed amongst the signals such that the sound emitters being in the first configuration in the second area collectively emit a first sound pattern, the first sound pattern configured to be received having a first audible sound information content with a first left channel frequency-amplitude distribution to be received by the left channel receiver of the sound receiver and a first right channel frequency-amplitude distribution to be received by the right channel receiver of the sound receiver at a first location in the audience area a first distance from the near field compensation border and a second distance from the first reference location with the sound receiver facing the first reference location in the second area, the first sound pattern configured to be received having a second audible sound information content with a second left channel frequency-amplitude distribution to be received by the left channel receiver of the sound receiver and a second right channel frequency-amplitude distribution to be received by the right channel receiver of the sound receiver by the sound receiver at a second location in the audience area a third distance from the near field compensation border and a fourth distance from the first reference location with the sound receiver facing the first reference location in the second area, the first distance approximating the third distance, the second distance being different from the fourth distance, and the differences between the first left. Other features and advantages will become apparent from the accompanying detailed description and drawings.

BRIEF DESCRIPTION OF THE SEVERAL VIEWS OF THE DRAWING(S)

Figure 10:
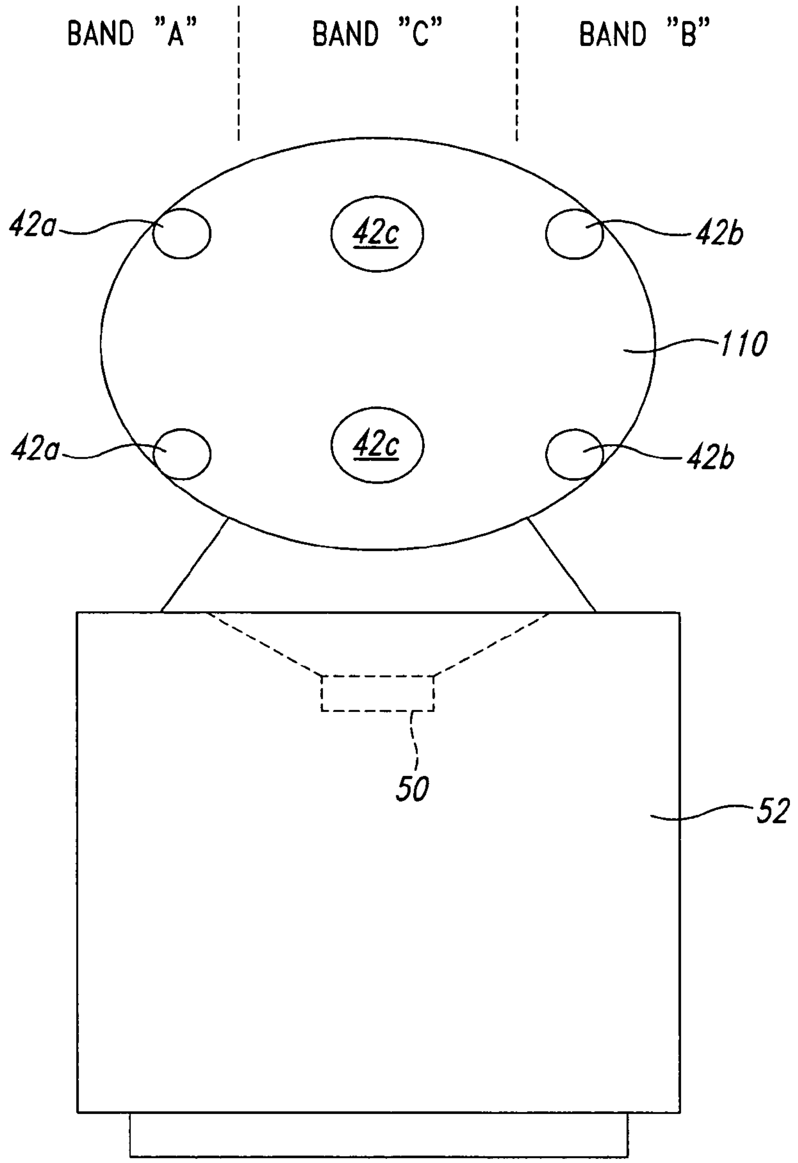
Figure 11:
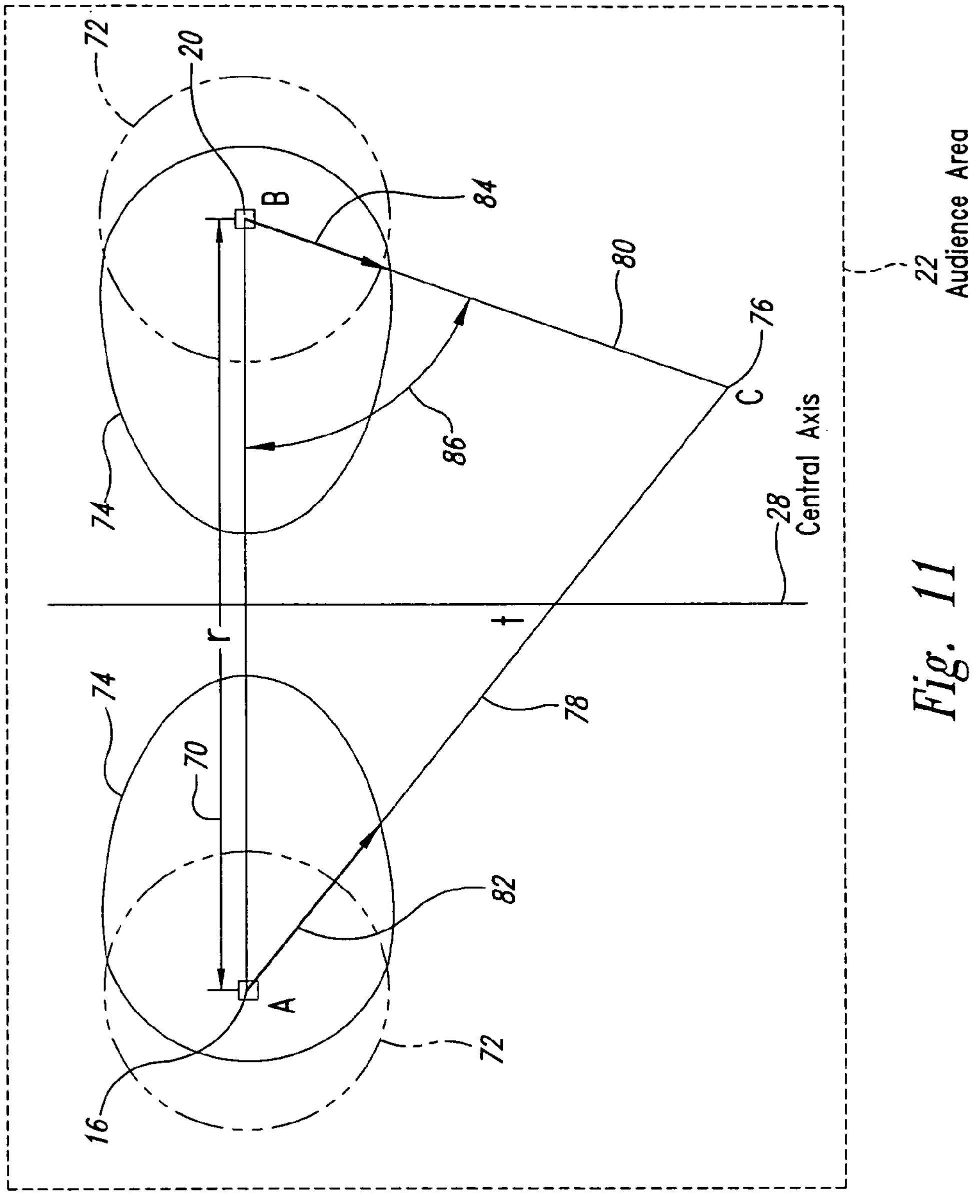

FIG. 10 is a front view of an implementation of the omnidirectional emitter array of the sound image system for small venues showing a plurality of emitters forming an array and with the high and mid frequency emitters divided into three bands FIG. 11 is an illustration of the relationship of an omnidirectional emitter array to the audience area and how the acoustic energy is apportioned. It illustrates the nonuniform sound amplitude emitted by each of two spaced-apart emitters with the sound amplitude as a function of angle represented by the distance of the arcs from the respective emitters.

Figure 9:
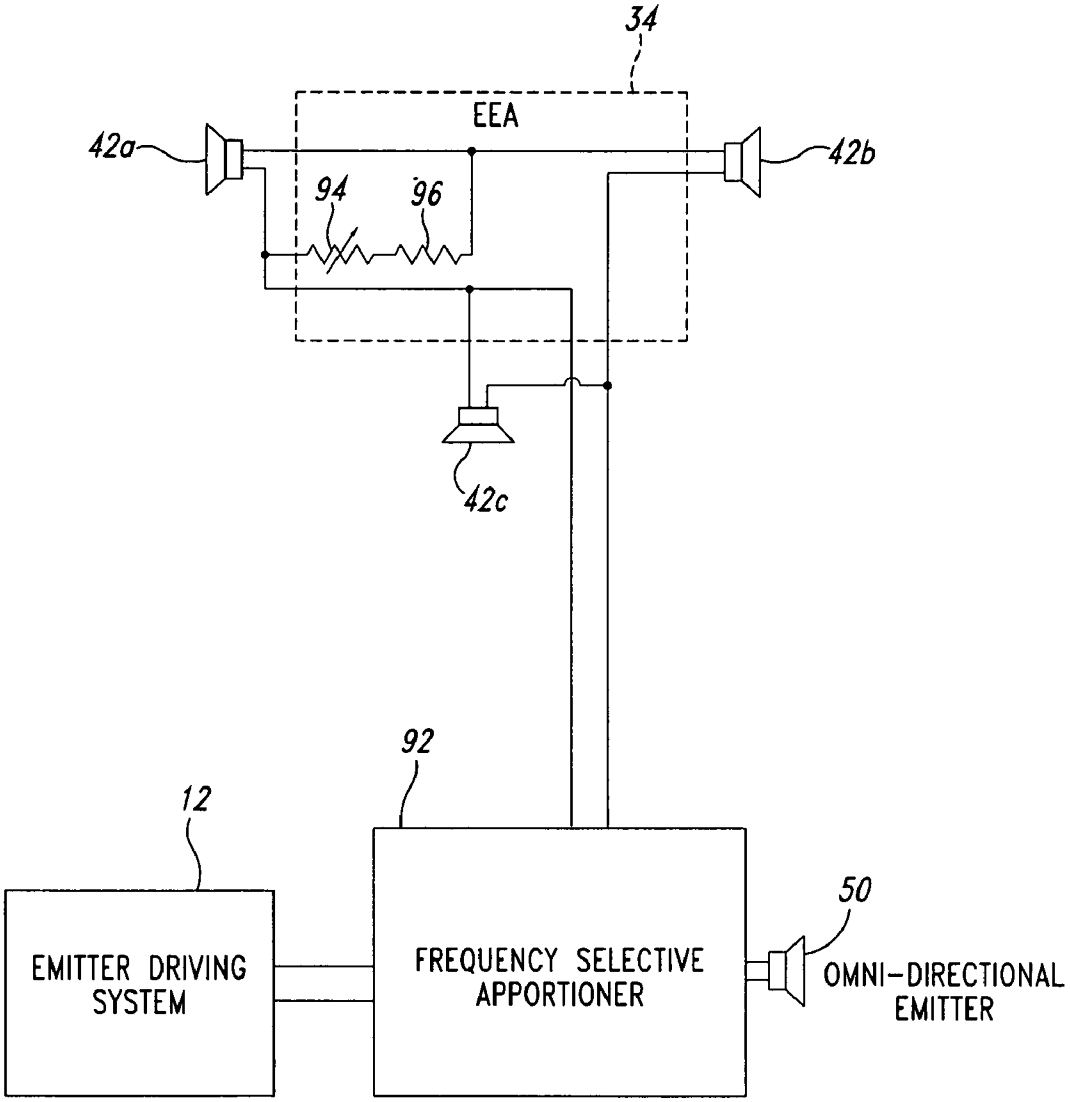
FIG. 9 is a schematic of the emitter driving assembly shown in FIGS. 7A and 7B utilizing resistive elements.
Figure 12:
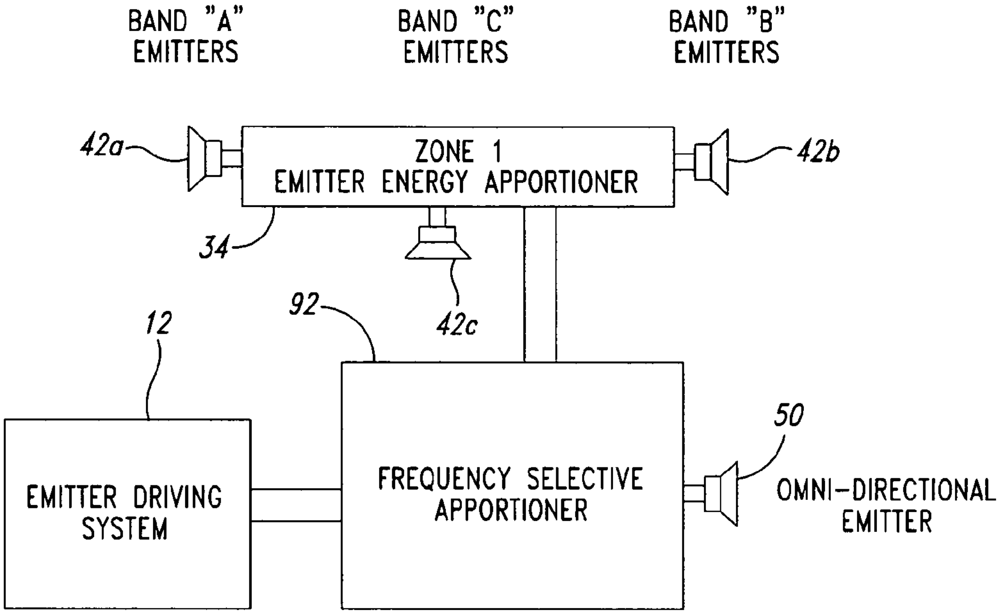

FIG. 12 is an electrical schematic appropriate to the emitter array of FIG. 9.

Figure 1:
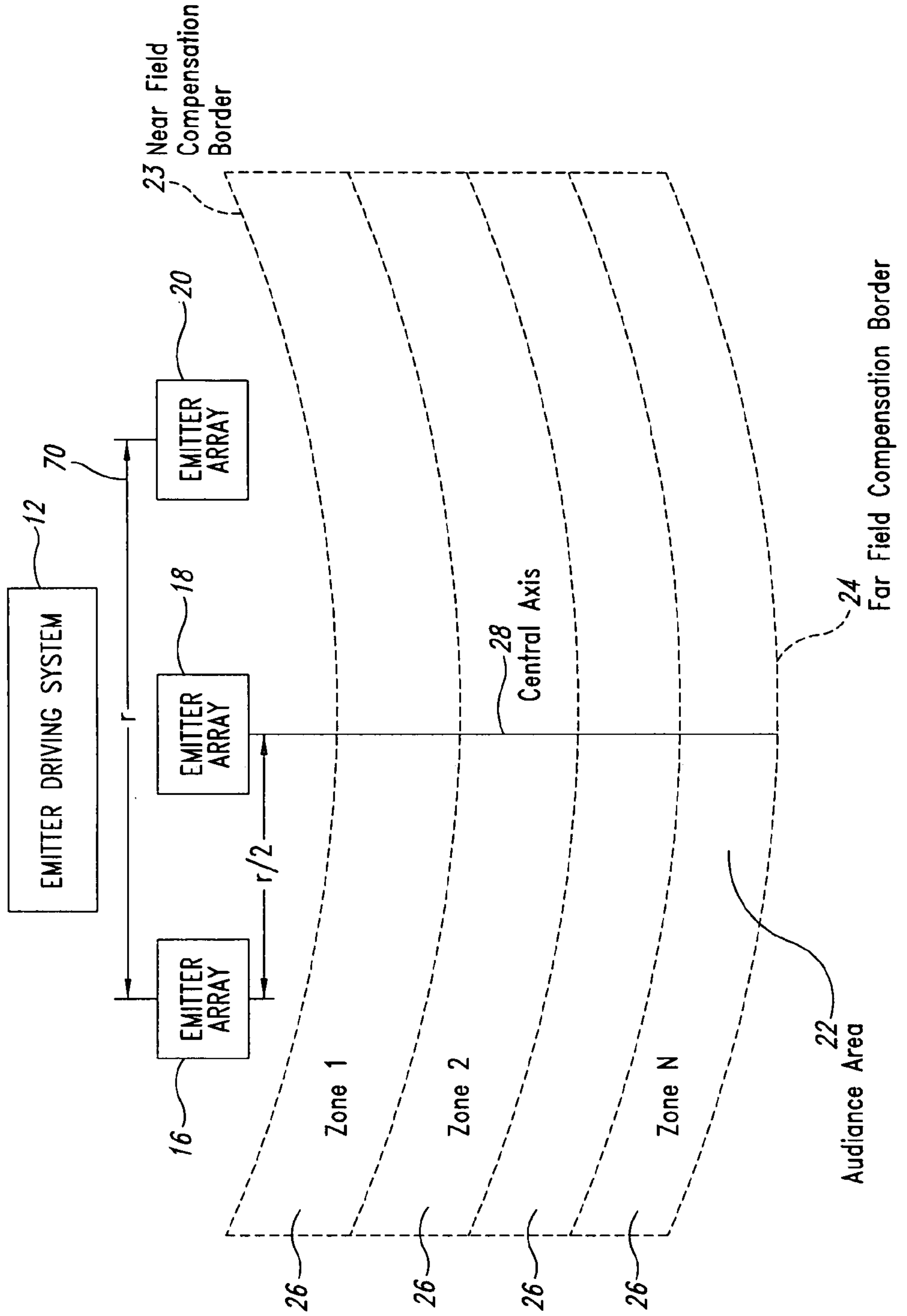
FIG. 1 is schematic of a sound image of a sound image system and associated audience zones.
Figure 13B:
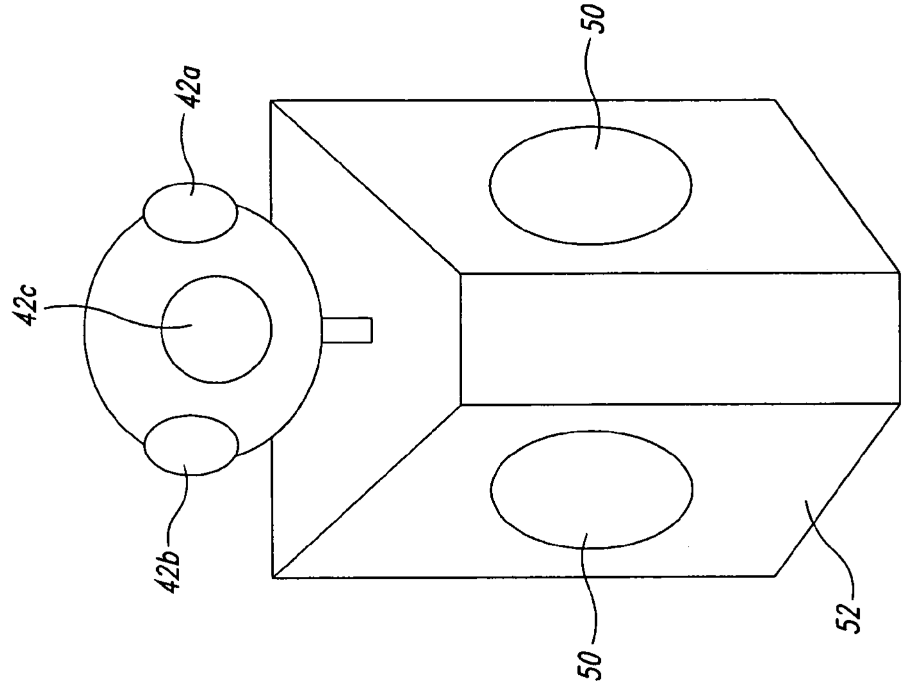
Figure 13A:
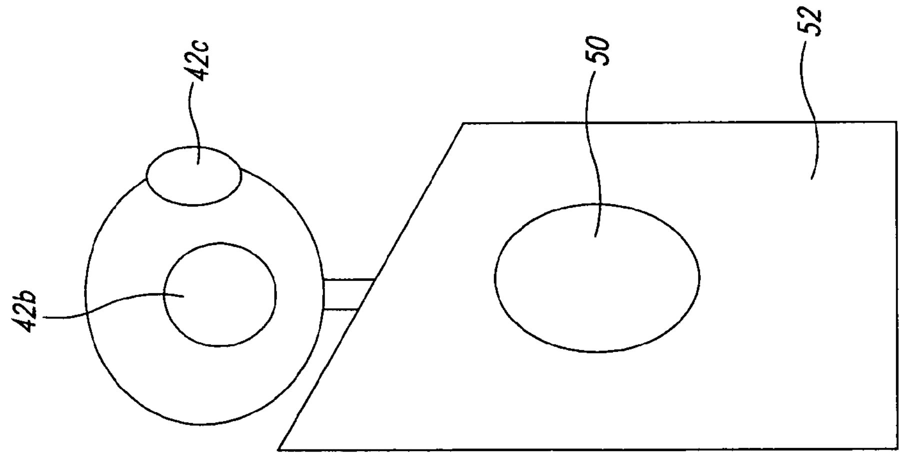

FIG. 13A is a side elevational schematic of a second implementation of the emitter array of FIG. 1.

FIG. 13B is a front elevational schematic of the second implementation of the emitter array of FIG. 13A.

Figure 14:
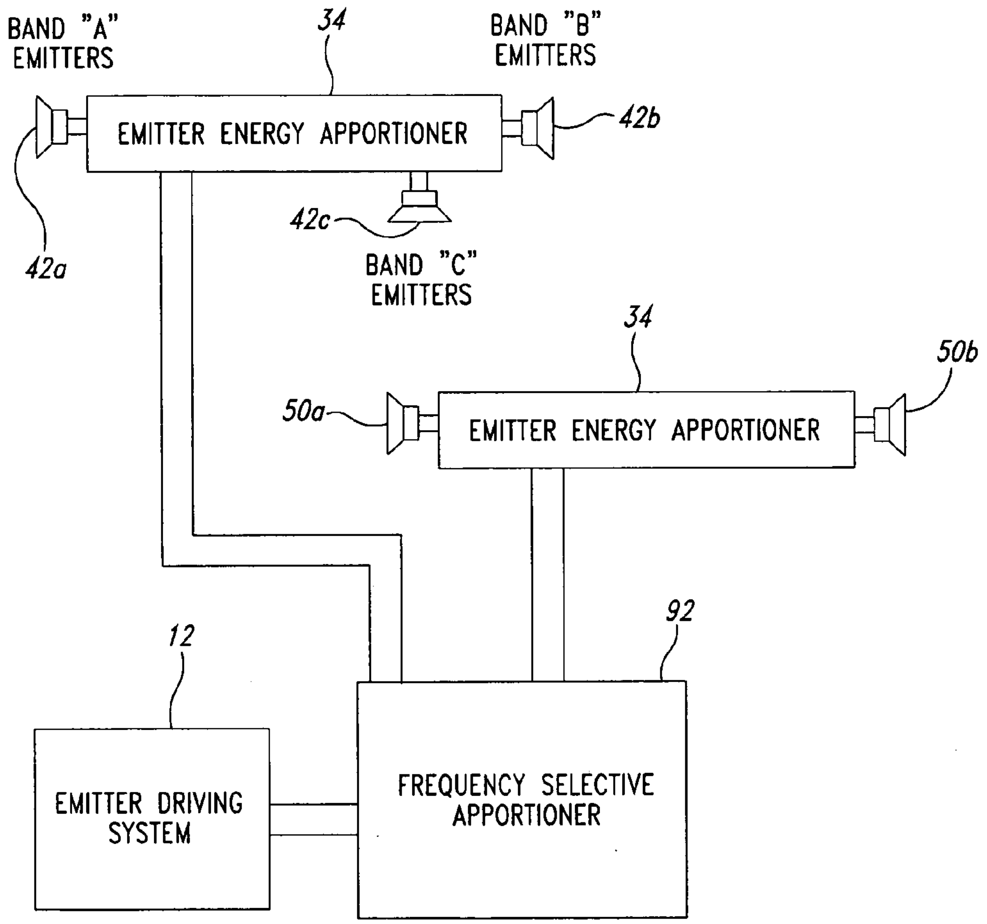

FIG. 14 is a schematic of a first electrical implementation of the emitter array shown in FIGS. 13A and 13B.

Figure 15:
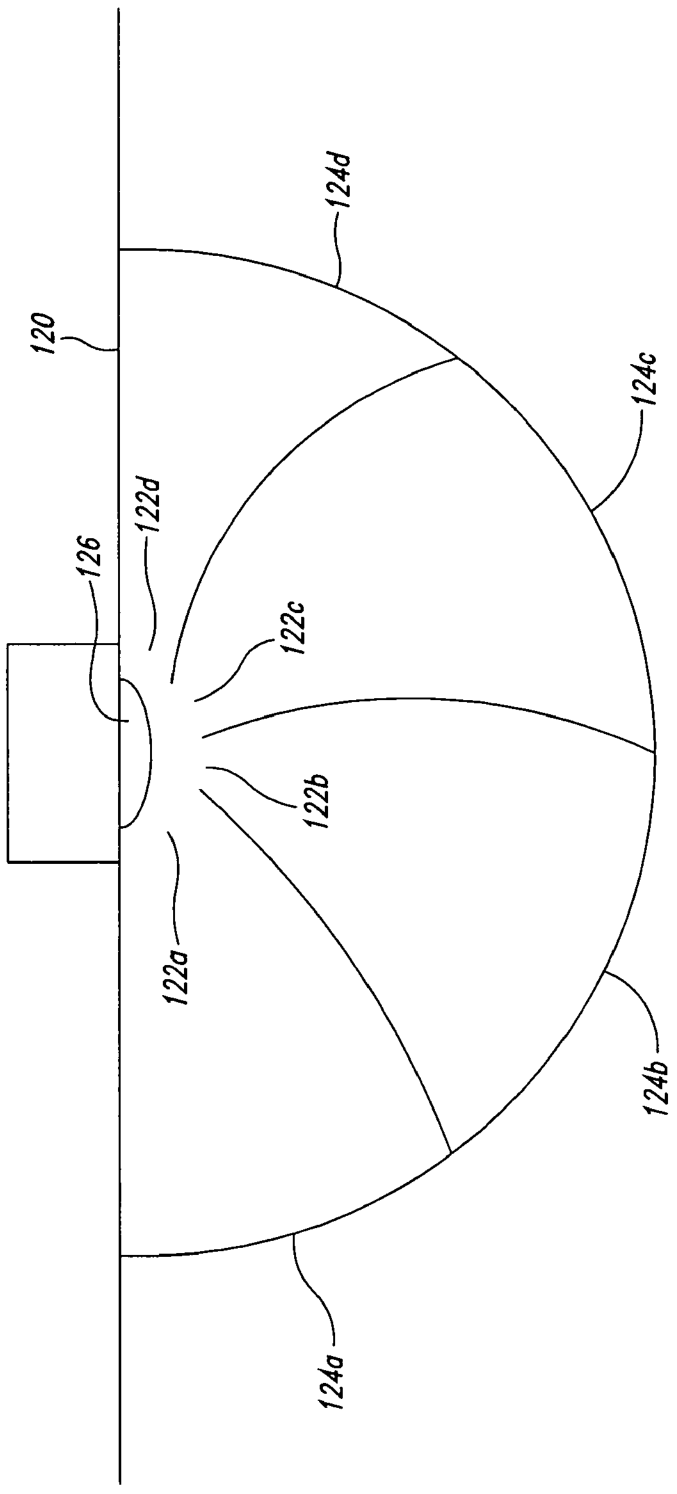

FIG. 15 is a section view of a horn radiator producing a non uniform radiation.

Figure 16:
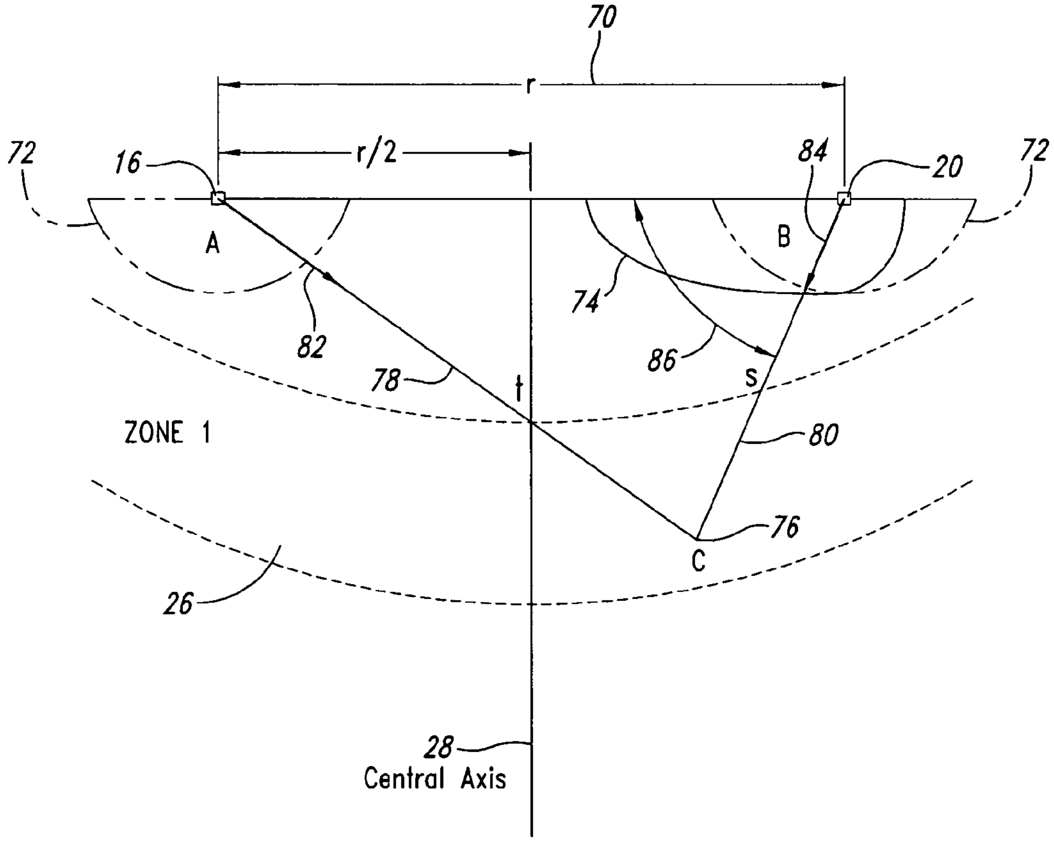

FIG. 16 is an exemplary schematic nonuniform sound amplitude emitted by the sound image system utilizing a-uniform emitter in cooperation with a nonuniform emitter.

DETAILED DESCRIPTION OF THE INVENTION

It is desirable to improve the stereo image integrity at sound receiver, listener, locations not equidistant from the emitters representing stereo components without diminishing stereo performance at locations that are equidistant from the emitters. It is also desirable to improve the listener enjoyment when sound reinforcement is used in live performance. Stereo image distortion frequently occurs in sound reproduction resulting from path length differences at various listening locations. The following embodiments reveal methods and implementations to achieve these goals. The embodiments correct for these losses by providing a method of locating the various listener locations by associating listener location with a unique angle of radiation from the emitter and then providing means to alter the emitter performance as a function of angle to provide a corrected amplitude at the listener. This may be achieved in a sound reproduction system provided signals representing industry standard stereo components.

Sound reproduction and reinforcement systems and methods are presented herein for spatially enhancing stereo images typically used such performances as those involving music. The embodiments seek to expand the amount of audience area that would receive a sound image that maintains sound reproduction fidelity regarding spatial orientation of sound sources involved in an original performance. To expand the audience area receiving spatially faithful sound reproduction certain characteristics of sound have been first studied to find important factors involved.

Frequency, phase and amplitude can all play a part in the ability to accurately determine the location of a sound source. It is generally accepted that wave frequency defines tonality and must be faithfully reproduced. It is also recognized that when all sound energy comes from a single emitter, the listener will be able to accurately locate the sound source regardless of listener position. Here the path length difference to each ear of the listener and thus the loudness sensed by each ear is dependant upon the orientation of the listener's head to the sound source.

In another case of multiple emitters where each emitter reproduces sound representing a different sound source relatively positioned at the location of the emitter, the reproduction is still faithful regardless of listener position. It is when one attempts to create the illusion of a sound source that is relatively positioned in a location other than a location of an emitter that image problems generally occur. An ideal case for conventional approaches is when listeners are equidistant from two or more emitters so that they receive correct amplitude information in the well known stereo effect. For conventional approaches, it is when a listener is not equidistant from the emitters and therefore have path length differences, that sound level anomalies occur.

Implementations of the sound image system uses emitter assemblies each having a collection of emitters arranged to produce a non-uniform sound amplitude radiation pattern which are collectively used together to reduce these anomalies. Other implementations use a mixture of emitter assemblies with at least one having a non-uniform radiation pattern. The non-uniform patterns of the emitter assemblies of the sound image system are fashioned so that for any location in an audience listening area, each emitter assembly located in a second area furnishes sound amplitudes at the location that are approximately equal to the sound amplitudes furnished by the other emitter assemblies of the sound image system for the location. To accomplish this requires a nonuniform amplitude distribution pattern from at least one of the emitters assemblies based upon the relative distances of the listener from the emitters.

In the implementation shown in FIG. 1 these anomalies are compensated using emitter arrays, EA's 16–20 in cooperation with an Emitter Driving System, EDS 12. Optimally this should be done while maintaining a substantially uniform frequency response, at least over the range of frequencies in which the listener is reliant for location information.

Figure 2:
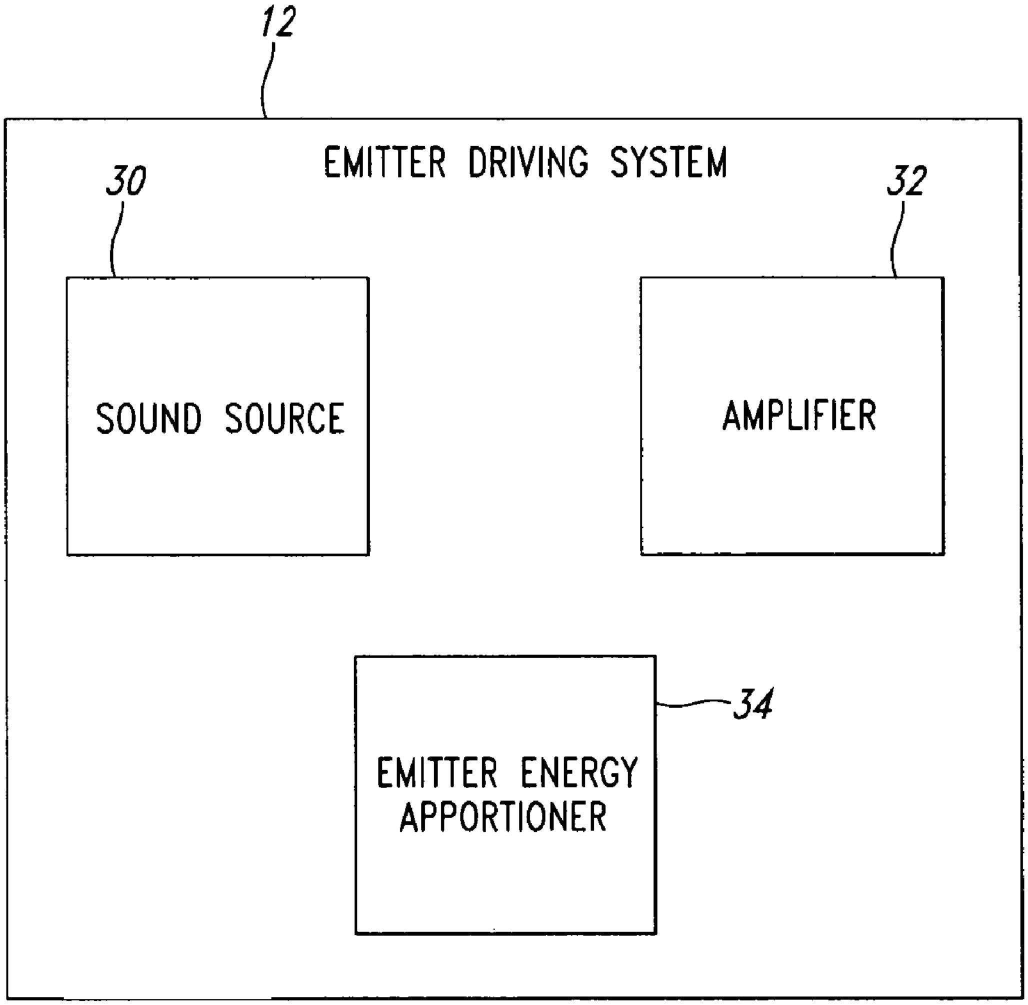
FIG. 2 is a schematic of an emitter driving system of FIG. 1.

In this system the EDS 12, shown in FIG. 2, includes a sound source 30, such as a compact disk player providing an electrical signals representative of a stereo audio signal. A multi channel amplifier 32 to provide the requisite energy to power the emitter arrays 16–20 and an Emitter Energy Apportioner, EEA 34. The EEA 34 may be a part of the amplifier, a functionality of the emitter array, EA, or as an element located anywhere within the EA or EDS 12, to distribute the energy within the EA's 16–20.

The EA's 16–20 are placed in a second area before an audience area 22, as shown in FIG. 1. EA "A" 16 is depicted as the left most array. EA "B" 20 is depicted as the right most EA with dimension r 70 being the distance between. EA's which may be located between are designated item 18. The central axis 28 is defined as all points equidistant from the left and right EA's and bisecting the audience area forming an imaginary axis line. The central axis 28 is described as imaginary in the sense that it is not typically visible but is used herein for descriptive purposes such as to describe placement of the EA's and other such arrangements. Since the sound anomalies are dependant upon the EA to listener distance the audience area 22 may be further divided into zones 1-n 26. Zone 1 is designated as the near field zone and is bounded by the near field compensation border 23.This represents the boundary at which maximum correction is defined. At the other extreme are the most distant listener locations and are referred to as the far field zone N 26. This zone is limited by the far field compensation border 24 and is the distance limit from the EA's at which the anomalies are substantially compensated. Between these two zones are located any further compensation zones 26.

The anomalies in each audience area are compensated by causing the EA to direct more or less acoustic energy to that location. As the listener position moves further from the central axis 28, the compensation will increase. As the off axis listener position varies from the near field boundary 22 to the far field boundary 24, the compensation will decrease.

Figure 3:
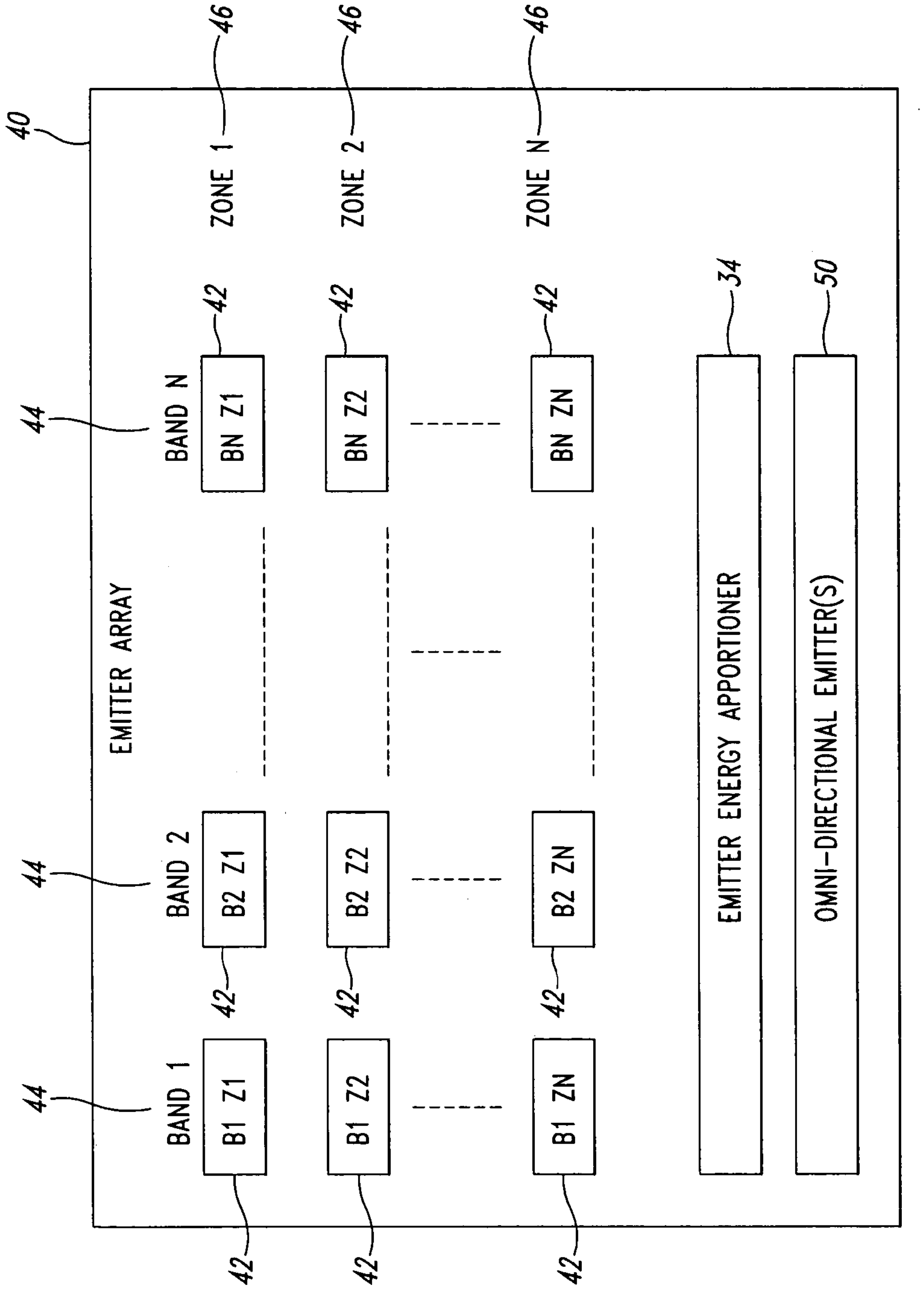
FIG. 3 is a schematic showing the generalized presentation of how emitter elements relate to the listener.

FIG. 3 is a general presentation of how the emitter array elements can be related to multiple zones and listener positions within a zone. The listener area 22 shown in FIG. 1 may be divided into a number of zones depending upon the size of the listening area. As depicted in FIG. 1, zone 1 is the listener area closest to the emitter arrays and the emitters providing primary sound energy within this band are designated B1 Z1–Bn Z1. Bands 1-N provide the varying sound energy as determined by the EEA 34 for off axis listener positions within the zone. Emitter groups designated Zone 2-N similarly provide primary sound energy to additional audience Zones 46

Figure 4:
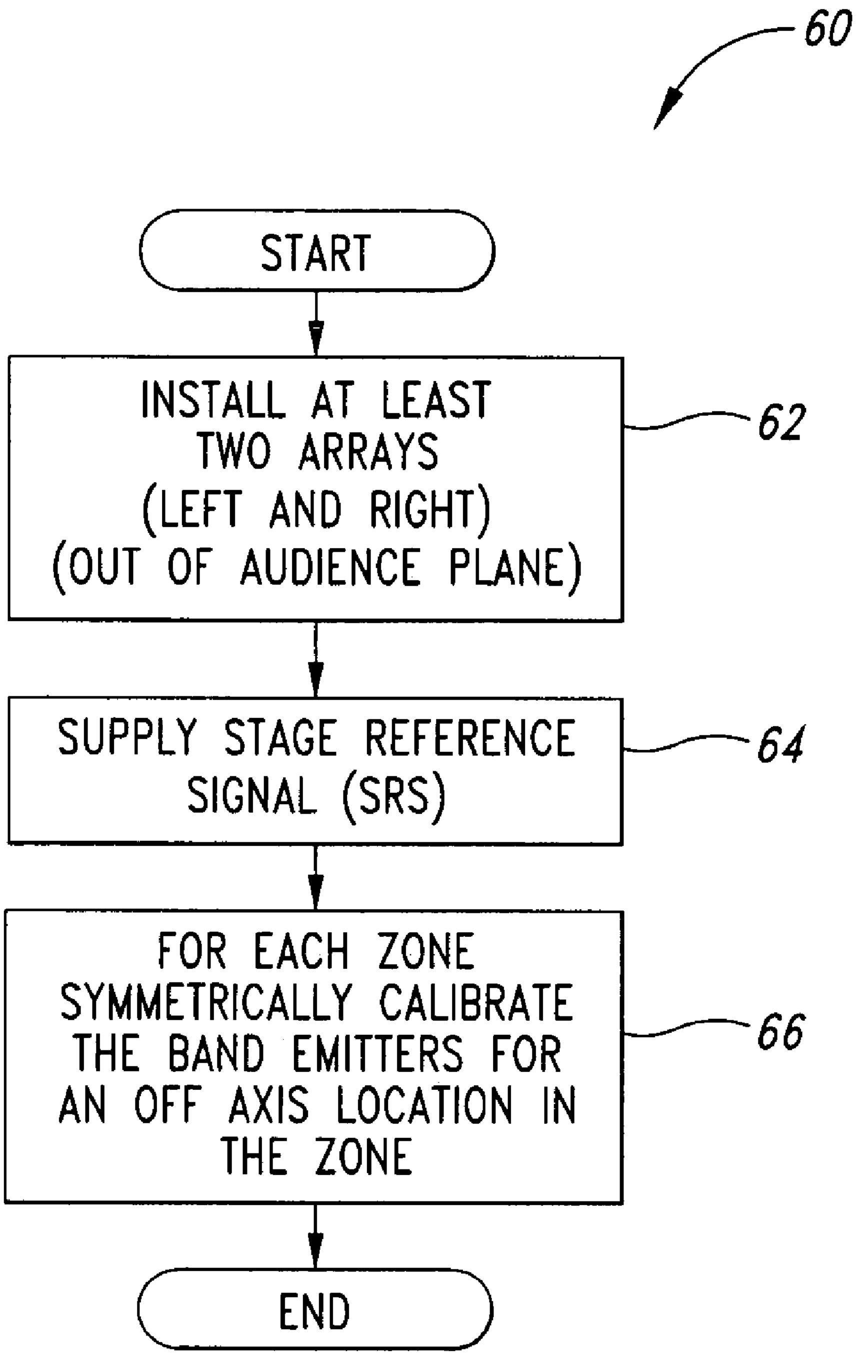
FIG. 4 is a flow chart of a calibration method for the sound image system of FIG. 1.
Figure 5:
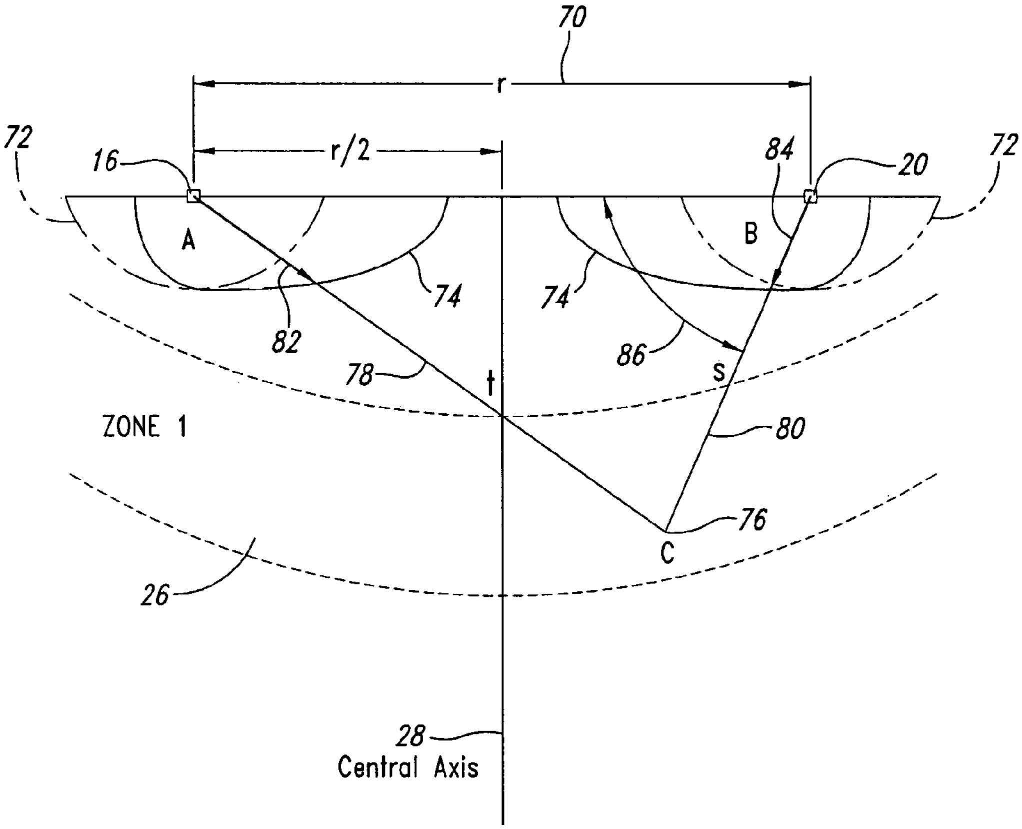
FIG. 5 is an exemplary schematic nonuniform sound amplitude emitted by the sound image system of FIG. 1. It illustrates the nonuniform sound amplitude emitted by each of two spaced-apart emitters with the sound amplitude as a function of angle represented by the distance of the arcs from the respective emitters.

An implementation, as shown in FIG. 4, includes the following steps. Install at least two emitter arrays, left and right 62. To provide more than one compensation zone these will be located above or below the audience plane. Supply a stage reference input to the EDS 64. This input should simulate a sound source located between the emitter arrays. Select a zone and symmetrically adjust the drive energy to the band emitters via the EEA 34 for an off axis location 66. If this is done ratio metrically, all locations within the zone will be corrected. Repeat the process for each set of emitters serving each zone. By making the EEA ratio metric, that is, what ever energy reduction is made toward one side of the central axis, a proportional increase will be made to the other side of the central axis 28. Additionally the left EA "A" 16 will be the complementary mirror image of the right EA "B" 20 as shown in FIG. 5. When these relationships are followed system adjustment may be reduced to only one adjustment per zone.

The most sensitive indicator of correct compensation is when a sound source e.g. a solo instrument or singer, is equidistant between the EA's and the selected audience location is near the left or right extreme. At this location a listener may direct the system adjustment so that the soloist image appears equidistant between the EA's. Alternatively acoustic measurements may be made of each EA to ensure equal sound levels at the selected listener position.

The polar graph in FIG. 5 represents such resultant nonuniform radiation patterns 74 from a pair of EA's. These patterns are tailored to alter the radiated sound energy as a function of direction in a fashion opposite to that introduced by the geometry distortion and are shown as matching in amplitude but complementary in direction for the two EA's, "A" 16 and "B" 20. FIG. 5 graphically shows the non uniform distribution from the implementation shown in FIG. 1.

The necessary correction in emitter amplitude from two EA's, "A" 16 and "B" 20 are evaluated as follows. We let A 16 and B 20 represent locations of EA's that are electrically driven as a stereo pair and C 76 represent an arbitrary listening position, as shown in FIG. 5. Further, we let r 70 represent the distance between A and B, s 80 the distance between B and C, t 78 the distance between A and C, and q 86 the angle between lines AB and BC. Then, $$t^2=r^2+s^2-2rs\cos q$$

Given that sound amplitude decreases with the square of the distance from an emitter, then at C the sound from EA "A" 16 decreases by 1/s2 and the sound from EA "B" 20 decreases by 1/t2. To accurately recreate sound images along line r, the EA at "A" must have an amplitude different from that of the AE at "B" by a factor, f, of (t2/s2), or $$f=(r/s)^2+2(r/s)\cos q.$$

The sound amplitude radiated by each EA (Ac) 82,84, in acoustic units (db), as a function of angle will be: Ac=10 log($(r/s)^2$+2(r/s)cos q.) The method described herein provides the necessary sound dispersion corrections without compromising the fidelity of the reproduction devices utilized in its implementation.

Figure 6:
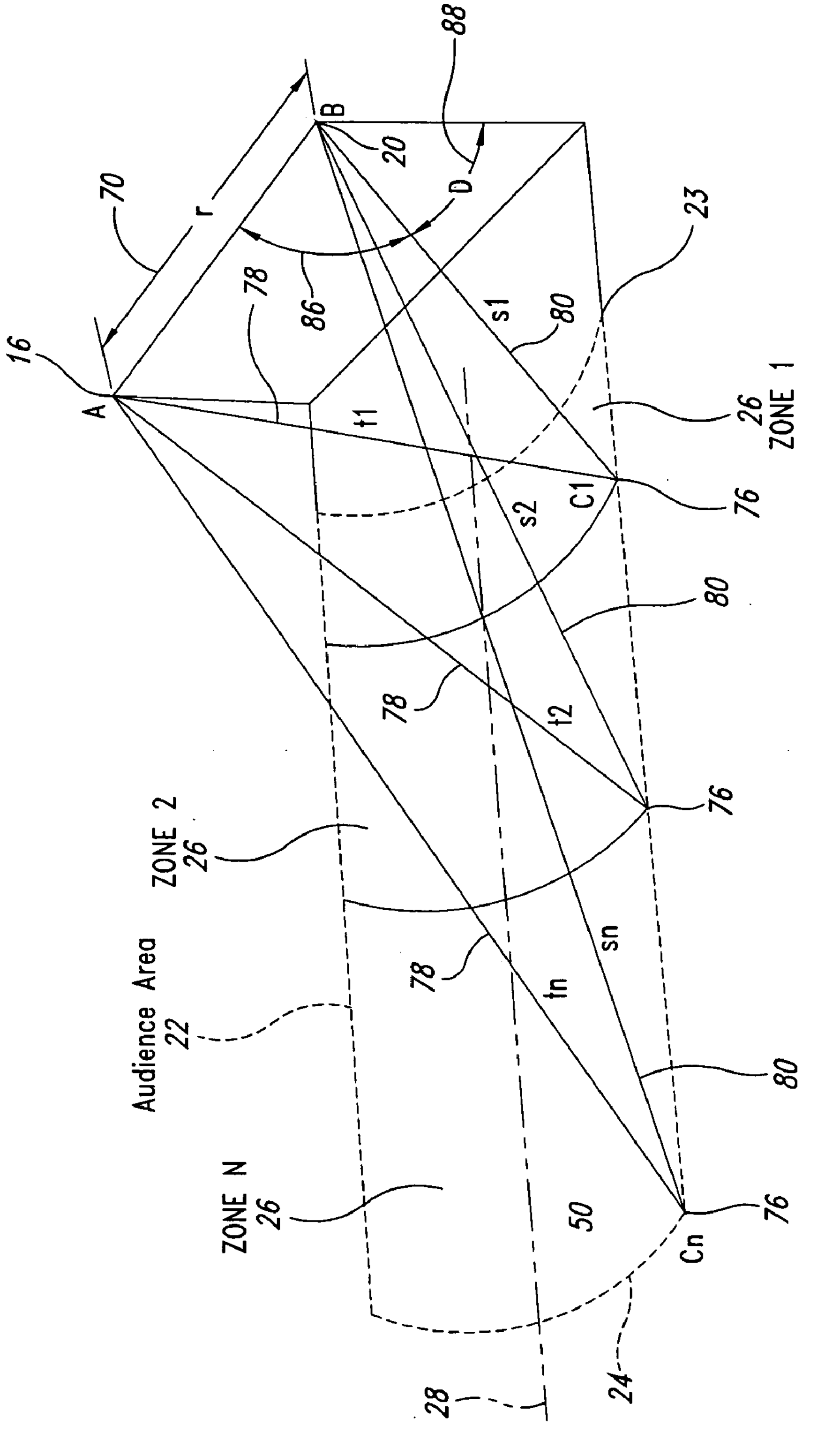
FIG. 6 is an exemplary schematic of the geometric relationship of two spaced-apart first implementations of the emitted assemblies and the listener audience relationships.

To provide proper amplitude corrections over a large audience area, EA's "A" and "B" are displaced from the audience plane, as defined as the locus of all listener positions within the audience area 22, as shown in FIG. 6, so that, as the listener distance varies, so will the emitter angle to the listener, angle "D" 88 and correspondingly the loudness correction. It will be recognized that as the audience depth, C1 to Cn, increases so will angle "D" 88 and the required variation in correction will also change. In small venues such as a home, EA's "A" 16 and "B" 20 may be co located in the listener plane while still offering amplitude corrections as the listener position varies left and right of the central axis.

Figure 7B:
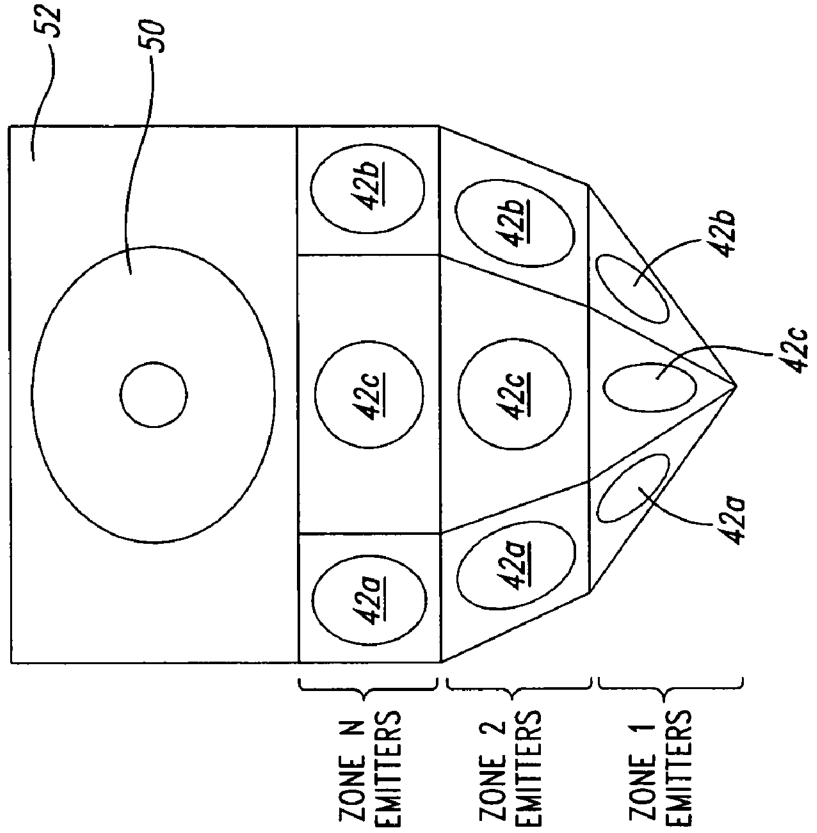
FIG. 7B is a front elevational schematic of a first implementation of the emitter assembly of the sound image system.
Figure 7A:
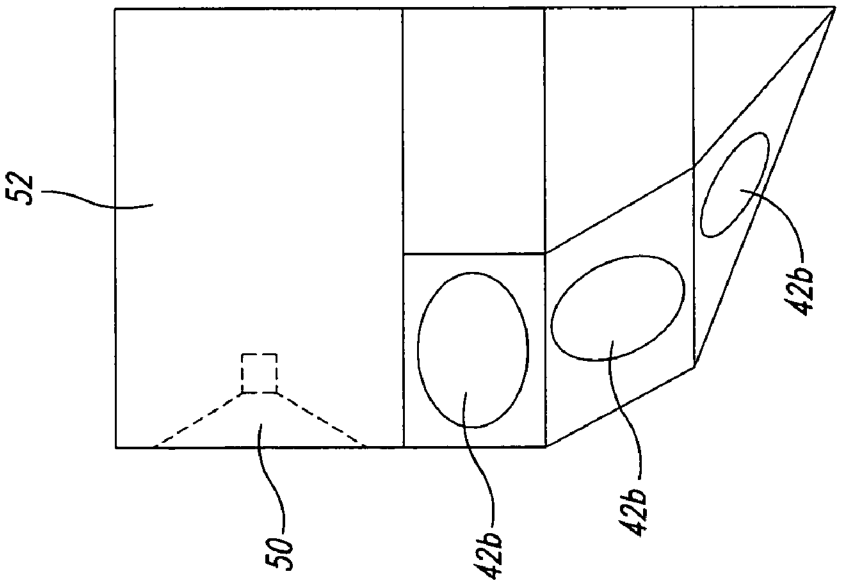
FIG. 7A is a side elevational schematic of a first implementation of the emitter assembly of the sound image system.
Figure 8:
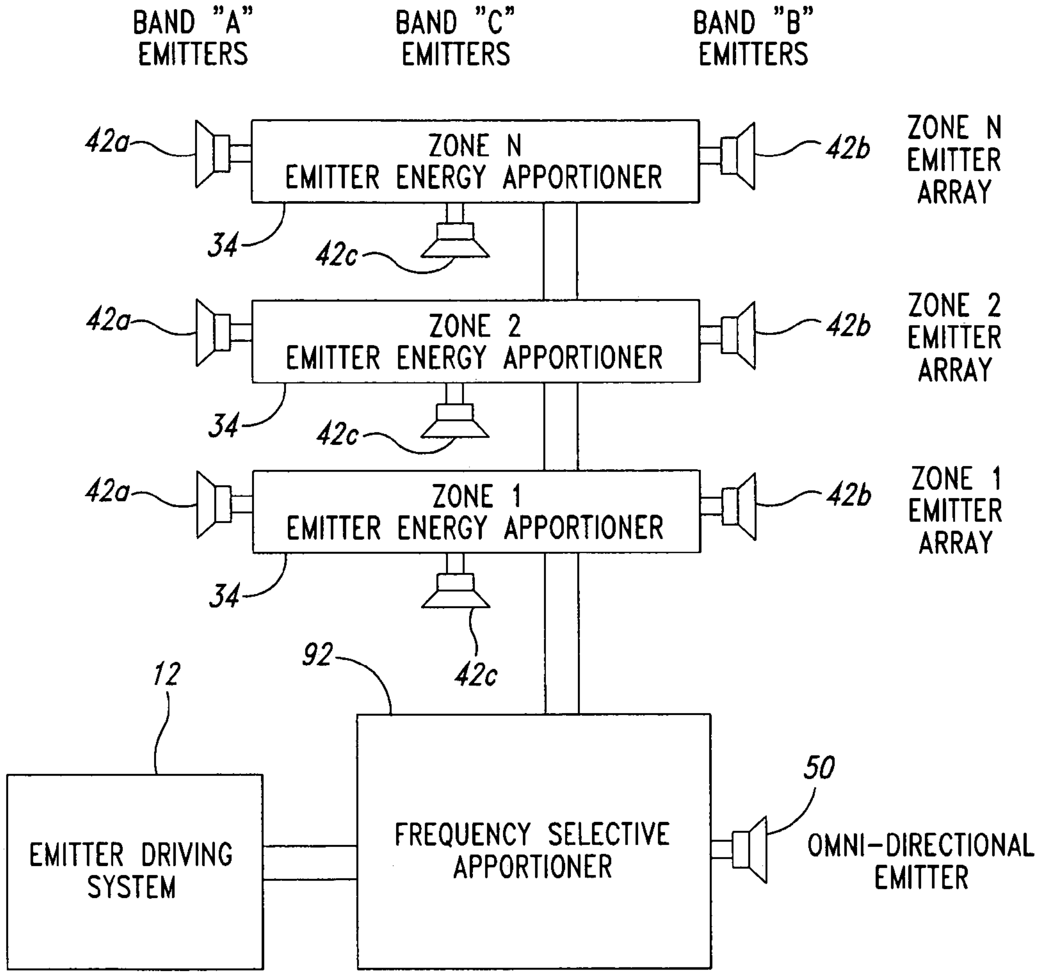
FIG. 8 is a schematic of a first electrical implementation of the first electrical implementation of the emitter assembly shown in FIGS. 7A and 7B.

The front view of a typical implementation is shown in FIG. 7*b* and the side view is shown in FIG. 7*a*. To create the desired non uniform radiation pattern from this array, some emitters 42*a* must radiate more energy than others 42*b*. In this implementation the emitters 42 are divided horizontally to serve three "zones" 26. One set of emitters are vertically oriented toward the far field zone, "zone N",. A second set "1" is vertically oriented toward the closest listener area, Zone 1, the near field zone. The remaining emitters comprise a third set that is oriented toward an intermediate listener area as shown in FIG. 6. These sets are orthogonally subdivided into three bands. Band "A" represents all emitters 42*a* oriented toward the listener area requiring increased radiation and band "B" 42*b* represents all the emitters oriented toward the listener area requiring decreased radiation. Band "C" 42*c* represents all the emitters that require no alteration of their radiation. The EEA in this implementation as depicted in FIG. 8 provides the means for adjusting the distribution of drive energy between Bands A 42*a* & B 42*b* and therefor the desired non uniform radiation is shown in FIG. 5. The EEA 34 using electrical elements to apportion the electrical energy is preferable to use of dissimilar emitters since it allows adjustment for listening environment and allows all emitters 42 to be identical. In this implementation a frequency selective apportioner 92 diverts the low frequency energy to low frequency emitter 50 and also diverts the mid and high frequency energy to the EEA's 34 and thence to the EA emitters 42 that form Zone 1. This energy is similarly diverted to each of the other. EEA's the serve Zones 2-N. The EEA for each zone may be used to adjust the compensation as a function of horizontal angle q 86 to compensate anomalies at varying listener positions within the zone 26.

One implementation of an EEA contains a resistive network used to apportion energy from one set of emitters to another set of emitters. A simple implementation of such a network incorporated as an EEA is designated as item 34 in FIG. 9. In this implementation a variable resistive element 94 placed in shunt with an emitter set to be diminished in amplitude 42*a* causes less energy to be received at the shunted emitters. As the variable resistive element 94 is reduced in resistance the other series emitters 42*b* will receive more energy. Thus by varying the value of the variable resistive element 94 the energy apportionment may be varied. An additional resistive element 96 may be placed in series with the variable resistive element 94 to limit the extent to which the energy may be unequal An implementation for small listening venues, illustrated in FIG. 10, incorporates a plurality of emitters to form an array that can approximate the response of an acoustical four pi steradian point source. Such an array lends itself to an implementation as it radiates in all directions with a uniform frequency response and through the incorporation of an adjustable EEA can produce the nonuniform radiation patterns as shown in FIG. 1 1. In this implementation vertically facing low frequency emitter 50 in an appropriate enclosure 52 to control the out of phase emissions operates in cooperation with an ellipsoidal reflector 110 to reproduce the low frequency portion of the spectrum with omni directional radiation. The mid and high frequencies are reproduced by a plurality of emitters 42 situated on that ellipsoid to form an array. If all emitters receive equal drive energy, the sound energy will be equal in all directions as depicted as a circle 72 in FIG. 11. To create the desired non uniform radiation pattern 74 from this array, some emitters must receive more energy than others. In this implementation the emitters 42 have been divided into three "bands". Band "C" 42*c* is vertically oriented orthogonally to the inter array axis (A–B). Band "A" represents the emitters 42*a* oriented toward the listener area requiring increased radiation and band "B" 42*b* represents the emitters oriented toward the listener area requiring decreased radiation. In this implementation the EEA for adjusting the distribution of drive energy and therefor the desired non uniform radiation may be similar to the one shown in FIG. 12. Using electrical elements to redistribute the electrical energy is preferable to use of dissimilar emitters since it allows adjustment for listening environment and allows all emitters 42 to be identical. In this arrangement a frequency selective apportioner 92 diverts the low frequency energy to low frequency emitter 50 and also diverts the mid and high frequency energy to the EEA 34 and thence to the emitters. The emitters in the array are divided into three bands. The central emitter band "C" 42*c*, which are not amplitude altered and two variable bands of emitters "A" 42*a* and "B" 42*b*. The redistribution of sound energy is depicted as an ellipse 74 in FIG. 11. This implementation offers no compensation as a function of room depth but compensates only on a single curve before and a matching curve behind the speakers. The extent that a further listener is not on those curves or on the central axis 28, the amplitude will be unequal though it will be an improvement over systems without amplitude compensation. This configuration does not incorporate separate zones related to listener distance. Since vertical distribution angle is not a consideration the emitters may be co located in the listener plane and may be appropriate for many small listening environments such as a home. In the distance relationship given above, if s 80 and t 78 are chosen to be much greater than the inter speaker distance, r 70, it is seen that the errors occurring on such large arcs will suffer only a slight degradation and that for most purposes they can be ignored.

As a further implementation the radiant energy can also be restricted vertically in a more conventional radiation pattern where the majority of the sound energy is directed toward the audience. FIG. 13 depicts a representative implementation achieving the desired nonuniform amplitude pattern. FIG. 13*b* shows this implementation in a frontal view and FIG. 13*a* shows a side view. In this implementation two low frequency emitters 50 are oriented toward the listening area. Three emitters 42 to reproduce the mid and high frequencies are oriented with one intended to be toward the listening area and the other two oriented; one to the left and one to the right. Utilizing an EEA more energy is distributed to one of the angled emitters 42*a* and less to the other angled emitter 42*b*. This creates the non uniform energy distribution desired in this implementation and is shown in FIG. 5. The overall system of this implementation is shown in FIG. 14.

In this implementation the EEA 34 causes one emitter 42*a* to receive less drive energy and emitter 42*b* will receive more. Additionally the low frequency emitters 50*a* and 50*b* may be adjusted to redistribute the sound energy as a function of angle by incorporating an additional EEA as shown in FIG. 14.

As an additional implementation a refractor horn 120 as shown in FIG. 15 may be utilized in place of the afore utilized arrays. In this implementation the essentially uniform radiation of an emitter 126 is intercepted by a refractor horn with non uniform dimensions and redirects the acoustic energy to the listening areas with a nonuniform intensity. The EEA in this implementation is a property of the asymmetrical construction of the refractor horn. The nonuniform energy apportionment is determined by appropriate selection of the horn entrance 122 and exit areas 124. As depicted in FIG. 15 the horn exit areas 124 are equal and the entrance angles and areas 122 are varied as a function of angle and illustrates only one of many possible combinations that, to those skilled in the art, would be known to achieve the same result. As depicted entrance D 122*d* is the smallest and will therefor direct the least acoustic energy to its corresponding exit 124*d*. Entrance A 122*a* is the largest entrance and will therefor direct the largest amount of acoustic energy to its corresponding exit 124*a*. Entrances B 122*b* and C 122*c* are proportioned to the areas of A and D. Thus, the desired directivity may be achieved by purely mechanoacoustic means, without associated electronic components or signal processing. The horn designer selects the apportionment and the EEA is a property of its design. A typical installation would consist of two or more horn emitters installed as complementary pairs.

An implementation can consist of only one nonuniform emitter as shown in FIG. 16. In this configuration one emitter array, selected for purposes of demonstration as emitter array "B", generates a non uniform radiation to compensate for emitter to listener distances. Emitter "A" has a uniform radiation pattern, emanating substantially uniform energy toward the audience area. This implementation while demonstrating that all the compensation can be provided by only one nonuniform emitter array also demonstrates that there exist a continuum of divisions which can correct the spatial anomalies. This implementation does however suffer from a variation in overall sound intensity when a listener position is changed. When the listener moves from left to right he will experience a decrease in overall sound intensity. As the anomaly correction becomes more evenly distributed between the emitter arrays, the intensity variation tends to diminish.

From the foregoing it will be appreciated that, although specific implementations have been described herein for the purposes of illustration, various modifications may be made without deviating from the spirit and scope of the invention. Accordingly, the invention is not limited except as by the appended claims.

The invention claimed is:

1. A system for an audience area, the audience area having a near field compensation border, the audience area being adjacent a second area along the near field compensation border, the second area having a first reference location the system comprising:

a plurality of sound emitters configured to be placed in a first configuration in the second area; and an emitter energy apportioner configured to be coupled to the plurality of sound emitters to send signals to the sound emitters having energy distributed amongst the signals such that the sound emitters being in the first configuration in the second area collectively emit a first sound pattern, the first sound pattern configured to be received having a first sound energy amplitude for at least a first sound frequency by a sound receiver at a first location in the audience area a first distance from the near field compensation border and a second distance from the first reference location with the sound receiver facing the first reference location in the second area, the first sound pattern configured to be received having a second sound energy amplitude for at least the first sound frequency by the sound receiver at a second location in the audience area a third distance from the near field compensation border and a fourth distance from the first reference location with the sound receiver facing the first reference location in the second area, the first distance approximating the third second distance, the second distance being different from the fourth distance, and the first sound energy amplitude approximating the second sound energy amplitude.

2. A system for an audience area, the audience area having a near field compensation border, the audience area containing a sound receiver having a left channel sound receiver and a right channel sound receiver, the audience area being adjacent a second area along the near field compensation border, the second area having a first reference location the system comprising:

a plurality of sound emitters configured to be placed in a first configuration in the second area; and an emitter energy apportioner configured to be coupled to the plurality of sound emitters to send signals to the sound emitters having energy distributed amongst the signals such that the sound emitters being in the first configuration in the second area collectively emit a first sound pattern, the first sound pattern configured to be received having a first audible sound information content with a first left channel frequency-amplitude distribution to be received by the left channel receiver of the sound receiver and a first right channel frequency-amplitude distribution to be received by the right channel receiver of the sound receiver at a first location in the audience area a first distance from the near field compensation border and a second distance from the first reference location with the sound receiver facing the first reference location in the second area, the first sound pattern configured to be received having a second audible sound information content with a second left channel frequency-amplitude distribution to be received by the left channel receiver of the sound receiver and a second right channel frequency-amplitude distribution to be received by the right channel receiver of the sound receiver by the sound receiver at a second location in the audience area a third distance from the near field compensation border and a fourth distance from the first reference location with the sound receiver facing the first reference location in the second area, the first distance approximating the third distance, the second distance being different from the fourth distance, and the differences between the first left channel frequency-amplitude distribution and the first right channel frequency-amplitude distribution approximating the differences between the second left channel frequency-amplitude distribution and the second right channel frequency-amplitude distribution.

3. The system of claim 2 wherein the sound receiver is a human and the left channel sound receiver is the human's left ear and the right channel sound receiver is the human's right ear, and wherein the first audible sound information content and the second audible sound information content are of one of a solo performer.

4. A system for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the system comprising:

a first emitter array having a first plurality of sound emitters located in the second area on a first side of the axis line, at least one of the first plurality of sound emitters positioned as an inwardly directed first emitter to emit sound toward the audience area and toward the axis line, at least one of the first plurality of sound emitters positioned as an outwardly directed first emitter to emit sound toward the audience area and away from the axis line; a second emitter array having a second plurality of sound emitters located in the second area on a second side of the axis line, at least one of the second plurality of sound emitters positioned as an inwardly directed second emitter to emit sound toward the audience area and toward the axis line, at least one of the second plurality of sound emitters positioned as an outwardly directed second emitter to emit sound toward the audience area and away from the axis line; and an emitter energy apportioner configured to be coupled to the first plurality of sound emitters and the second plurality of sound emitters to send a first signal having a first information content to the first plurality of sound emitters in an apportioned manner so that the first signal received by the inwardly directed first emitter has a larger magnitude than the first signal received by the outwardly directed first emitter and to send a second signal having a second information content to the second plurality of sound emitters in an apportioned manner so that the second signal received by the inwardly directed second emitter has a larger magnitude than the first signal received by the outwardly directed second emitter.

5. A system for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the system comprising:

a first emitter array having a first plurality of sound emitters located in the second area on a first side of the axis line, a first of the first plurality of sound emitters positioned to direct a center of a sound wave at a first angle with respect to the axis line and a second of the first plurality of sound emitters to direct a center of a sound wave sound at a second angle with respect to the axis line; a second emitter array having a second plurality of sound emitters located in the second area on a second side of the axis line, a first of the second plurality of sound emitters positioned to direct a center of a sound wave at a third angle with respect to the axis line and a second of the second plurality of sound emitters to direct a center of a sound wave sound at a fourth angle with respect to the axis line; and an emitter energy apportioner configured to be coupled to the first plurality of sound emitters and the second plurality of sound emitters to send a first signal having a first information content to the first plurality of sound emitters in an apportioned manner so that the first signal received by the first of the first plurality of sound emitters has a different degree of magnitude than the first signal received by the second of the first plurality of sound emitters and to send a second signal having a second information content to the second plurality of sound emitters in an apportioned manner so that the second signal received by the first of the second plurality of sound emitters has a different degree of magnitude than the second signal received by the second of the second plurality of sound emitters so that at a number of locations in the audience area equidistant from the near field compensation border and at different distances from the axis line the amplitude of sound received from the first emitter array is approximately constant and the amplitude of sound received from the second emitter array is approximately constant.

6. A system for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the system comprising:

a first emitter array having a first plurality of sound emitters located in the second area on a first side of the axis line, at least one of the first plurality of sound emitters positioned as an inwardly directed first emitter to emit sound toward the audience area and toward the axis line, at least one of the first plurality of sound emitters positioned as an outwardly directed first emitter to emit sound toward the audience area and away from the axis line; a second emitter array having a second plurality of sound emitters located in the second area on a second side of the axis line, at least one of the second plurality of sound emitters positioned as an inwardly directed second emitter to emit sound toward the audience area and toward the axis line, at least one of the second plurality of sound emitters positioned as an outwardly directed second emitter to emit sound toward the audience area and away from the axis line; and an emitter energy apportioner configured to be coupled to the first plurality of sound emitters and the second plurality of sound emitters to send a first signal having a first information content to the first plurality of sound emitters and to send a second signal having a second information content to the second plurality of sound emitters in an apportioned manner so that as the amplitude of the first signal received by the inwardly directed-first emitter is increased in amplitude a first degree, the amplitude of the first signal received by the outwardly directed first emitter is decreased in amplitude by the first degree and the second signal received by the inwardly directed second emitter is increased by the first degree and the second signal received by the outwardly directed second emitter is decreased by the first degree.

7. A system for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the system comprising:

a first emitter array having a first plurality of sound emitters located in the second area on a first side of the axis line, at least one of the first plurality of sound emitters positioned as an inwardly directed first emitter to emit sound toward the audience area and toward the axis line, at least one of the first plurality of sound emitters positioned as an outwardly directed first emitter to emit sound toward the audience area and away from the axis line; a second emitter array having a second plurality of sound emitters located in the second area on a second side of the axis line, at least one of the second plurality of sound emitters positioned as an inwardly directed second emitter to emit sound toward the audience area and toward the axis line, at least one of the second plurality of sound emitters positioned as an outwardly directed second emitter to emit sound toward the audience area and away from the axis line; and an emitter energy apportioner configured to be coupled to the first plurality of sound emitters and the second plurality of sound emitters to send a first signal having a first information content to the first plurality of sound emitters and to send a second signal having a second information content to the second plurality of sound emitters in an apportioned manner so that as the amplitude of the sound emitted by the inwardly directed first emitter is increased in the amplitude a first degree, the amplitude of the sound emitted by the outwardly directed first emitter is decreased in amplitude by the first degree, the sound emitted by the inwardly directed second emitter is increased by the first degree and the sound emitted by the outwardly directed second emitter is decreased by the first degree.

8. A system for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the system comprising:

a first emitter array having a first plurality of sound emitters located in the second area on a first side of the axis line, the first plurality having a plurality of rows of sound emitters, the emitters for each row being angled differently relative to a horizontal reference, each of the rows of emitters being associated with a different section of the audience area having a different minimum distance and a different maximum distance from the near field compensation border, for each row, at least one of the first plurality of sound emitters positioned as an inwardly directed first emitter to emit sound toward the audience area and toward the axis line, for each row, at least one of the first plurality of sound emitters positioned as an outwardly directed first emitter to emit sound toward the audience area and away from the axis line; a second emitter array having a second plurality of sound emitters located in the second area on a second side of the axis line, the second plurality having a plurality of rows of sound emitters, the emitters for each row being angled differently relative to a horizontal reference, each of the rows of emitters being associated with a different section of the audience area having a different minimum distance and a different maximum distance from the near field compensation border, for each row, at least one of the second plurality of sound emitters positioned as an inwardly directed second emitter to emit sound toward the audience area and toward the axis line, for each row, at least one of the second plurality of sound emitters positioned as an outwardly directed second emitter to emit sound toward the audience area and away from the axis line; and an emitter energy apportioner configured to be coupled to the first plurality of sound emitters and the second plurality of sound emitters to send a first signal having a first information content to the first plurality of sound emitters in an apportioned manner so that the first signal received by the inwardly directed first emitter of each row has a larger magnitude than the first signal received by the outwardly directed first emitter of each row, the difference in magnitudes between signals being received by the inwardly directed first emitter and outwardly directly first emitter of each row being smaller as the row is associated with sections of the audience area with larger minimum and maximum distances from the near field border, and to send a second signal having a second information content to the second plurality of sound emitters in an apportioned manner so that the second signal received by the inwardly directed second emitter of each row has a larger magnitude than the first signal received by the outwardly directed second emitter of each row, the difference in magnitudes between signals being received by the inwardly directed second emitter and outwardly directly second emitter of each row being smaller as the row is associated with sections of the audience area with larger minimum and maximum distances from the near field border.

9. A system for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the system comprising:

a first emitter array having a first plurality of sound emitters located in the second area on a first side of the axis line, the first plurality having a plurality of rows of sound emitters, the emitters for each row being angled differently relative to a horizontal reference, each of the rows of emitters being associated with a different section of the audience area having a different minimum distance and a different maximum distance from the near field compensation border, for each row, at least one of the first plurality of sound emitters positioned as an inwardly directed first emitter to emit sound toward the audience area and toward the axis line, for each row at least one of the first plurality of sound emitters positioned as an outwardly directed first emitter to emit sound toward the audience area and away from the axis line; a second emitter array having a second plurality of sound emitters located in the second area on a second side of the axis line, the second plurality having a plurality of rows of sound emitters, the emitters for each row being angled differently relative to a horizontal reference, each of the rows of emitters being associated with a different section of the audience area having a different minimum distance and a different maximum distance from the near field compensation border, for each row, at least one of the second plurality of sound emitters positioned as an inwardly directed second emitter to emit sound toward the audience area and toward the axis line, for each row, at least one of the second plurality of sound emitters positioned as an outwardly directed second emitter to emit sound toward the audience area and away from the axis line; and an emitter energy apportioner configured to be coupled to the first plurality of sound emitters and the second plurality of sound emitters to send a first signal having a first information content to the first plurality of sound emitters and to send a second signal having a second information content to the second plurality of sound emitters in an apportioned manner so that as the amplitude of the sound emitted by the inwardly directed first emitter of each row is increased in the amplitude a first relative degree, the amplitude of the sound emitted by the outwardly directed first emitter of each row is decreased in amplitude by the first relative degree, the sound emitted by the inwardly directed second emitter of each row is increased by the first relative degree and the sound emitted by the outwardly directed second emitter of each row is decreased by the first relative degree.

10. A system for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the system comprising:

a first emitter array having a first plurality of sound emitters located in the second area on a first side of the axis line, a first of the first plurality of sound emitters positioned to direct a center of a sound wave at a first angle with respect to the axis line and a second of the first plurality of sound emitters positioned to direct a center of a sound wave sound at a second angle with respect to the axis line; a second emitter array having a second plurality of sound emitters located in the second area on a second side of the axis line, a first of the second plurality of sound emitters positioned to direct a center of a sound wave at a third angle with respect to the axis line and a second of the second plurality of sound emitters positioned to direct a center of a sound wave sound at a fourth angle with respect to the axis line; and an emitter energy apportioner configured to be coupled to the first plurality of sound emitters and the second plurality of sound emitters to send a first signal having a first information content to the first plurality of sound emitters in an apportioned manner so that the first signal received by the first of the first plurality of sound emitters has a different degree of magnitude than the first signal received by the second of the first plurality of sound emitters and to send a second signal having a second information content to the second plurality of sound emitters in an uniform manner so that the second signal received by the first of the second plurality of sound emitters approximates the degree of magnitude of the second signal received by the second of the second plurality of sound emitters so that at a first location in the audience area a first distant from the near field compensation border and at second distance from the axis line, for a range of audible sound frequencies, the relative difference between the amplitude of sound received from the first emitter array and the amplitude of sound received from the second emitter array approximates the relative difference between the amplitude of sound received from the first emitter array and the amplitude of sound received from the second emitter array at a second location in the audience area being the first distance from the near field compensation border and being a distance from the axis line other than the second distance.

11. A system for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the system comprising:

a first emitter array having a first plurality of sound emitters located in the second area on a first side of the axis line, a first of the first plurality of sound emitters positioned to direct a center of a sound wave at a first angle with respect to the axis line and a second of the first plurality of sound emitters positioned to direct a center of a sound wave sound at a second angle with respect to the axis line; a second emitter array having a second plurality of sound emitters located in the second area on a second side of the axis line, a first of the second plurality of sound emitters positioned to direct a center of a sound wave at a third angle with respect to the axis line and a second of the second plurality of sound emitters positioned to direct a center of a sound wave sound at a fourth angle with respect to the axis line; and an emitter energy apportioner configured to be coupled to the first plurality of sound emitters and the second plurality of sound emitters to send a first signal having a first information content to the first plurality of sound emitters in an apportioned manner so that the first signal received by the first of the first plurality of sound emitters has a different degree of magnitude than the first signal received by the second of the first plurality of sound emitters and to send a second signal having a second information content to the second plurality of sound emitters in an apportioned manner so that the second signal received by the first of the second plurality of sound emitters has a different degree of magnitude than the second signal received by the second of the second plurality of sound emitters so that at a first location in the audience area a first distant from the near field compensation border and at second distance from the axis line, for a range of audible sound frequencies, the relative difference between the amplitude of sound received from the first emitter array and the amplitude of sound received from the second emitter array approximates the relative difference between the amplitude of sound received from the first emitter array and the amplitude of sound received from the second emitter array at a second location in the audience area being the first distance from the near field compensation border and being a distance from the axis line other than the second distance.

12. A method for an audience area, the audience area having a near field compensation border, the audience area being adjacent a second area along the near field compensation border, the second area having a first reference location, the method comprising:

placing a plurality of sound emitters in a first configuration in the second area; and sending signals to the sound emitters having energy distributed amongst the signals such that the sound emitters being in the first configuration in the second area collectively emit a first sound pattern, the first sound pattern configured to be received having a first sound energy amplitude for at least a first sound frequency by a sound receiver at a first location in the audience area a first distance from the near field compensation border and a second distance from the first reference location with the sound receiver facing the first reference location in the second area, the first sound pattern configured to be received having a second sound energy amplitude for at least the first sound frequency by the sound receiver at a second location in the audience area a third distance from the near field compensation border and a fourth distance from the first reference location with the sound receiver facing the first reference location in the second area, the first distance approximating the third second distance, the second distance being different from the fourth distance, and the first sound energy amplitude approximating the second sound energy amplitude.

13. A method for an audience area, the audience area having a near field compensation border, the audience area containing a sound receiver having a left channel sound receiver and a right channel sound receiver, the audience area being adjacent a second area along the near field compensation border, the second area having a first reference location the method comprising:

placing a plurality of sound emitters configured in a first configuration in the second area; and sending signals to the plurality of sound emitters having energy distributed amongst the signals such that the sound emitters being in the first configuration in the second area collectively emit a first sound pattern, the first sound pattern configured to be received having a first audible sound information content with a first left channel frequency-amplitude distribution to be received by the left channel receiver of the sound receiver and a first right channel frequency-amplitude distribution to be received by the right channel receiver of the sound receiver at a first location in the audience area a first distance from the near field compensation border and a second distance from the first reference location with the sound receiver facing the first reference location in the second area, the first sound pattern configured to be received having a second audible sound information content with a second left channel frequency-amplitude distribution to be received by the left channel receiver of the sound receiver and a second right channel frequency-amplitude distribution to be received by the right channel receiver of the sound receiver by the sound receiver at a second location in the audience area a third distance from the near field compensation border and a fourth distance from the first reference location with the sound receiver facing the first reference location in the second area, the first distance approximating the third distance, the second distance being different from the fourth distance, and the differences between the first left channel frequency-amplitude distribution and the first right channel frequency-amplitude distribution approximating the differences between the second left channel frequency-amplitude distribution and the second right channel frequency-amplitude distribution.

14. A method for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the method comprising:

having a first plurality of sound emitters in the second area on a first side of the axis line, at least one of the first plurality of sound emitters positioned as an inwardly directed first emitter to emit sound toward the audience area and toward the axis line, at least one of the first plurality of sound emitters positioned as an outwardly directed first emitter to emit sound toward the audience area and away from the axis line;

having a second plurality of sound emitters in the second area on a second side of the axis line, at least one of the second plurality of sound emitters positioned as an inwardly directed second emitter to emit sound toward the audience area and toward the axis line, at least one of the second plurality of sound emitters positioned as an outwardly directed second emitter to emit sound toward the audience area and away from the axis line;

sending a first signal having a first information content to the first plurality of sound emitters in an apportioned manner so that the first signal received by the inwardly directed first emitter has a larger magnitude than the first signal received by the outwardly directed first emitter; and sending a second signal having a second information content to the second plurality of sound emitters in an apportioned manner so that the second signal received by the inwardly directed second emitter has a larger magnitude than the first signal received by the outwardly directed second emitter.

15. A method for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the method comprising:

having a first plurality of sound emitters in the second area on a first side of the axis line, a first of the first plurality of sound emitters positioned to direct a center of a sound wave at a first angle with respect to the axis line and a second of the first plurality of sound emitters to direct a center of a sound wave sound at a second angle with respect to the axis line;

having a second plurality of sound emitters in the second area on a second side of the axis line, a first of the second plurality of sound emitters positioned to direct a center of a sound wave at a third angle with respect to the axis line and a second of the second plurality of sound emitters to direct a center of a sound wave sound at a fourth angle with respect to the axis line;

sending a first signal having a first information content to the first plurality of sound emitters in an apportioned manner so that the first signal received by the first of the first plurality of sound emitters has a different degree of magnitude than the first signal received by the second of the first plurality of sound emitters; and sending a second signal having a second information content to the second plurality of sound emitters in an apportioned manner so that the second signal received by the first of the second plurality of sound emitters has a different degree of magnitude than the second signal, received by the second of the second plurality of sound emitters so that at a number of locations in the audience area equidistant from the near field compensation border and at different distances from the axis line the amplitude of sound received from the first emitter array is approximately constant and the amplitude of sound received from the second emitter array is approximately constant.

16. A method for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the method comprising:

having a first plurality of sound emitters in the second area on a first side of the axis line, at least one of the first plurality of sound emitters positioned as an inwardly directed first emitter to emit sound toward the audience area and toward the axis line, at least one of the first plurality of sound emitters positioned as an outwardly directed first emitter to emit sound toward the audience area and away from the axis line;

having a second plurality of sound emitters in the second area on a second side of the axis line, at least one of the second plurality of sound emitters positioned as an inwardly directed second emitter to emit sound toward the audience area and toward the axis line, at least one of the second plurality of sound emitters positioned as an outwardly directed second emitter to emit sound toward the audience area and away from the axis line; and sending a first signal having a first information content to the first plurality of sound emitters and a second signal having a second information content to the second plurality of sound emitters in an apportioned manner so that as the amplitude of the first signal received by the inwardly directed first emitter is increased in amplitude a first degree, the amplitude of the first signal received by the outwardly directed first emitter is decreased in amplitude by the first degree and the second signal received by the inwardly directed second emitter is increased by the first degree and the second signal received by the outwardly directed second emitter is decreased by the first degree.

17. A method for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the method comprising:

having a first plurality of sound emitters in the second area on a first side of the axis line, at least one of the first plurality of sound emitters positioned as an inwardly directed first emitter to emit sound toward the audience area and toward the axis line, at least one of the first plurality of sound emitters positioned as an outwardly directed first emitter to emit sound toward the audience area and away from the axis line;

having a second plurality of sound emitters in the second area on a second side of the axis line, at least one of the second plurality of sound emitters positioned as an inwardly directed second emitter to emit sound toward the audience area and toward the axis line, at least one of the second plurality of sound emitters positioned as an outwardly directed second emitter to emit sound toward the audience area and away from the axis line; and sending a first signal having a first information content to the first plurality of sound emitters and a second signal having a second information content to the second plurality of sound emitters in an apportioned manner so that as the amplitude of the sound emitted by the inwardly directed first emitter is increased in the amplitude a first degree, the amplitude of the sound emitted by the outwardly directed first emitter is decreased in amplitude by the first degree, the sound emitted by the inwardly directed second emitter is increased by the first degree and the sound emitted by the outwardly directed second emitter is decreased by the first degree.

18. A method for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the method comprising:

having a first plurality of sound emitters in the second area on a first side of the axis line, the first plurality having a plurality of rows of sound emitters, the emitters for each row being angled differently relative to a horizontal reference, each of the rows of emitters being associated with a different section of the audience area having a different minimum distance and a different maximum distance from the near field compensation border, for each row, at least one of the first plurality of sound emitters positioned as an inwardly directed first emitter to emit sound toward the audience area and toward the axis line, for each row, at least one of the first plurality of sound emitters positioned as an outwardly directed first emitter to emit sound toward the audience area and away from the axis line;

having a second plurality of sound emitters in the second area on a second side of the axis line, the second plurality having a plurality of rows of sound emitters, the emitters for each row being angled differently relative to a horizontal reference, each of the rows of emitters being associated with a different section of the audience area having a different minimum distance and a different maximum distance from the near field compensation border, for each row, at least one of the second plurality of sound emitters positioned as an inwardly directed second emitter to emit sound toward the audience area and toward the axis line, for each row, at least one of the second plurality of sound emitters positioned as an outwardly directed second emitter to emit sound toward the audience area and away from the axis line;

sending a first signal having a first information content to the first plurality of sound emitters in an apportioned manner so that the first signal received by the inwardly directed first emitter of each row has a larger magnitude than the first signal received by the outwardly directed first emitter of each row, the difference in magnitudes between signals being received by the inwardly directed first emitter and outwardly directly first emitter of each row being smaller as the row is associated with sections of the audience area with larger minimum and maximum distances from the near field border; and sending a second signal having a second information content to the second plurality of sound emitters in an apportioned manner so that the second signal received by the inwardly directed second emitter of each row has a larger magnitude than the first signal received by the outwardly directed second emitter of each row, the difference in magnitudes between signals being received by the inwardly directed second emitter and outwardly directly second emitter of each row being smaller as the row is associated with sections of the audience area with larger minimum and maximum distances from the near field border.

19. A method for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the method comprising:

having a first plurality of sound emitters in the second area on a first side of the axis line, the first plurality having a plurality of rows of sound emitters, the emitters for each row being angled differently relative to a horizontal reference, each of the rows of emitters being associated with a different section of the audience area having a different minimum distance and a different maximum distance from the near field compensation border, for each row, at least one of the first plurality of sound emitters positioned as an inwardly directed first emitter to emit sound toward the audience area and toward the axis line, for each row at least one of the first plurality of sound emitters positioned as an outwardly directed first emitter to emit sound toward the audience area and away from the axis line;

having a second plurality of sound emitters located in the second area on a second side of the axis line, the second plurality having a plurality of rows of sound emitters, the emitters for each row being angled differently relative to a horizontal reference, each of the rows of emitters being associated with a different section of the audience area having a different minimum distance and a different maximum distance from the near field compensation border, for each row, at least one of the second plurality of sound emitters positioned as an inwardly directed second emitter to emit sound toward the audience area and toward the axis line, for each row, at least one of the second plurality of sound emitters positioned as an outwardly directed second emitter to emit sound toward the audience area and away from the axis line; and sending a first signal having a first information content to the first plurality of sound emitters and a second signal having a second information content to the second plurality of sound emitters in an apportioned manner so that as the amplitude of the sound emitted by the inwardly directed first emitter of each row is increased in the amplitude a first relative degree, the amplitude of the sound emitted by the outwardly directed first emitter of each row is decreased in amplitude by the first relative degree, the sound emitted by the inwardly directed second emitter of each row is increased by the first relative degree and the sound emitted by the outwardly directed second emitter of each row is decreased by the first relative degree.

20. A method for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the method comprising:

having a first plurality of sound emitters in the second area on a first side of the axis line, a first of the first plurality of sound emitters positioned to direct a center of a sound wave at a first angle with respect to the axis line and a second of the first plurality of sound emitters positioned to direct a center of a sound wave sound at a second angle with respect to the axis line;

having a second plurality of sound emitters in the second area on a second side of the axis line, a first of the second plurality of sound emitters positioned to direct a center of a sound wave at a third angle with respect to the axis line and a second of the second plurality of sound emitters positioned to direct a center of a sound wave sound at a fourth angle with respect to the axis line; and sending a first signal having a first information content to the first plurality of sound emitters in an apportioned manner so that the first signal received by the first of the first plurality of sound emitters has a different degree of magnitude than the first signal received by the second of the first plurality of sound emitters and a second signal having a second information content to the second plurality of sound emitters in an uniform manner so that the second signal received by the first of the second plurality of sound emitters approximates the degree of magnitude of the second signal received by the second of the second plurality of sound emitters so that at a first location in the audience area a first distant from the near field compensation border and at second distance from the axis line, for a range of audible sound frequencies, the relative difference between the amplitude of sound received from the first emitter array and the amplitude of sound received from the second emitter array approximates the relative difference between the amplitude of sound received from the first emitter array and the amplitude of sound received from the second emitter array at a second location in the audience area being the first distance from the near field compensation border and being a distance from the axis line other than the second distance.

21. A method for an audience area, the audience area having a near field compensation border and a far field compensation border, the audience area having first and second portions on approximately either side of an imaginary axis line running from the near field compensation border to the far field compensation border, the audience area being adjacent a second area along the near field compensation border, the axis line extending into the second area, the method comprising:

having a first plurality of sound emitters in the second area on a first side of the axis line, a first of the first plurality of sound emitters positioned to direct a center of a sound wave at a first angle with respect to the axis line and a second of the first plurality of sound emitters positioned to direct a center of a sound wave sound at a second angle with respect to the axis line;

having a second plurality of sound emitters in the second area on a second side of the axis line, a first of the second plurality of sound emitters positioned to direct a center of a sound wave at a third angle with respect to the axis line and a second of the second plurality of sound emitters positioned to direct a center of a sound wave sound at a fourth angle with respect to the axis line; and sending a first signal having a first information content to the first plurality of sound emitters in an apportioned manner so that the first signal received by the first of the first plurality of sound emitters has a different degree of magnitude than the first signal received by the second of the first plurality of sound emitters and a second signal having a second information content to the second plurality of sound emitters in an apportioned manner so that the second signal received by the first of the second plurality of sound emitters has a different degree of magnitude than the second signal received by the second of the second plurality of sound emitters so that at a first location in the audience area a first distant from the near field compensation border and at second distance from the axis line, for a range of audible sound frequencies, the relative difference between the amplitude of sound received from the first emitter array and the amplitude of sound received from the second emitter array approximates the relative difference between the amplitude of sound received from the first emitter array and the amplitude of sound received from the second emitter array at a second location in the audience area being the first distance from the near field compensation border and being a distance from the axis line other than the second distance.

* * * * *